(12) United States Patent
Ou et al.

(10) Patent No.: US 12,006,590 B2
(45) Date of Patent: Jun. 11, 2024

(54) DEVICE FOR MANUFACTURING MONOCRYSTALLINE SILICON AND COOLING METHOD THEREOF

(71) Applicants: JINKO SOLAR CO., LTD., Jiangxi (CN); ZHEJIANG JINKO SOLAR CO., LTD., Zhejiang (CN)

(72) Inventors: Ziyang Ou, Zhejiang (CN); Xiaolong Bai, Zhejiang (CN); Xinyu Zhang, Zhejiang (CN)

(73) Assignees: JINKO SOLAR CO., LTD., Jiangxi (CN); ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 17/547,760

(22) Filed: Dec. 10, 2021

(65) Prior Publication Data

US 2022/0389608 A1    Dec. 8, 2022

(30) Foreign Application Priority Data

Jun. 4, 2021   (CN) .......................... 202110625936.3

(51) Int. Cl.
  *C30B 15/14*   (2006.01)
  *C30B 11/00*   (2006.01)
  *C30B 29/06*   (2006.01)

(52) U.S. Cl.
  CPC ............ *C30B 15/14* (2013.01); *C30B 11/003* (2013.01); *C30B 29/06* (2013.01); *Y10T 117/1088* (2015.01)

(58) Field of Classification Search
  CPC ....... C30B 11/003; C30B 15/00; C30B 15/14; C30B 29/06; C30B 35/00
  See application file for complete search history.

(56) References Cited

U.S. PATENT DOCUMENTS 5,849,080 A     12/1998  Okuno
2002/0144641 A1*  10/2002  Inagaki ................... C30B 29/06
                                                                  117/13

FOREIGN PATENT DOCUMENTS

CN   205821512        12/2016
CN   108179463 A  *  6/2018
(Continued)

OTHER PUBLICATIONS

European Search Report for Application No. 21214047.9, mailed Jul. 1, 2022 (8 pages).
(Continued)

*Primary Examiner* — Hua Qi
(74) *Attorney, Agent, or Firm* — NIXON PEABODY LLP; Jeffrey L. Costellia

(57) ABSTRACT

Provided is a device for manufacturing monocrystalline silicon and a cooling method thereof. The device includes a crystal puller and a cooling apparatus. A heating apparatus and a first thermal insulation structure are arranged in the crystal puller. The first thermal insulation structure is located above the heating apparatus. The cooling apparatus includes a jacking mechanism and a cooling pipe. The cooling pipe is capable of moving into or out of the crystal puller. When the cooling pipe enters the crystal puller, the cooling pipe is connected to the first thermal insulation structure, and the cooling pipe lifts the first thermal insulation structure through the jacking mechanism to increase a distance between the first thermal insulation structure and the heating apparatus, and a cooling medium is output to the cooling pipe to cool the crystal puller. The cooling medium may be liquid or gas.

16 Claims, 3 Drawing Sheets

(56) References Cited

FOREIGN PATENT DOCUMENTS

| | | | |
|---|---|---|---|
| CN | 207498510 U | * | 6/2018 |
| CN | 108624950 A | | 10/2018 |
| CN | 110468450 A | * | 11/2019 |
| CN | 110983429 A | * | 4/2020 |
| CN | 211199468 U | | 8/2020 |
| CN | 112210821 A | * | 1/2021 |
| EP | 0612867 A1 | | 8/1994 |
| JP | 06256087 A | | 9/1994 |
| JP | 06271396 A | | 9/1994 |
| JP | 2001010893 A | | 1/2001 |
| JP | 2003002788 A | * | 1/2003 |
| KR | 20100085640 A | | 7/2010 |

OTHER PUBLICATIONS

Chinese Notice of Grant of Patent Right for Invention for Application No. 202110625936.3, mailed Aug. 31, 2023 (5 pages).

\* cited by examiner

DEVICE FOR MANUFACTURING MONOCRYSTALLINE SILICON AND COOLING METHOD THEREOF

CROSS-REFERENCE TO RELATED APPLICATIONS

The present application claims priority to Chinese Patent Application No. 202110625936.3, filed on Jun. 4, 2021, the content of which is incorporated herein by reference in its entirety.

TECHNICAL FIELD

The present disclosure relates to the technical field of monocrystalline silicon manufacturing, and in particular, to a device for manufacturing monocrystalline silicon and a cooling method thereof.

BACKGROUND

Monocrystalline silicon is generally pulled in a crystal puller. After pulling of the monocrystalline silicon, a puller body is required to be cooled prior to a next manufacturing process. An existing crystal puller is generally naturally cooled. That is, the crystal puller stands at room temperature for 5 to 9 hours, which takes a long time. With the research and development of large-size monocrystalline silicon wafers in the industry, the cooling time of the crystal puller may be further prolonged. In order to ensure production efficiency, more crystal pullers are required to be put into operation, resulting in an increase in production costs.

SUMMARY

An objective of the present disclosure is to provide a device for manufacturing monocrystalline silicon and a cooling method thereof, so as to solve the problem of low cooling efficiency of the crystal puller in the related art.

The present disclosure provides a device for manufacturing monocrystalline silicon, including: a crystal puller; a heating apparatus arranged in the crystal puller; a first thermal insulation structure arranged in the crystal puller and located above the heating apparatus; and a cooling apparatus including a jacking mechanism and a cooling pipe. The cooling pipe is capable of moving into or out of the crystal puller. When the cooling pipe enters the crystal puller, the cooling pipe is connected to the first thermal insulation structure. The cooling pipe is configured to lift the first thermal insulation structure through the jacking mechanism to increase a distance between the first thermal insulation structure and the heating apparatus. The cooling pipe is further configured to output a cooling medium to the cooling pipe to cool the crystal puller.

In one or more embodiments, the cooling medium includes liquid and gas, for example, at least one of water, nitrogen, argon or helium.

In one or more embodiments, the device further includes a second thermal insulation structure arranged around the heating apparatus. The first thermal insulation structure covers over the second thermal insulation structure. The cooling pipe is configured to lift the first thermal insulation structure through the jacking mechanism to separate the first thermal insulation structure from the second thermal insulation structure.

In one or more embodiments, a sidewall of the crystal puller is provided with an opening, and the cooling pipe is capable of moving into or out of the crystal puller through the opening.

In one or more embodiments, the first thermal insulation structure is provided with support holes for allowing the cooling pipe to pass through the first thermal insulation structure, and the support holes are symmetrically distributed along an axial direction of the first thermal insulation structure.

In one or more embodiments, the cooling pipe is provided with a boss, and the cooling pipe is supported in the support holes by the boss.

In one or more embodiments, the cooling pipe further includes a plurality of vent holes arranged along an axial direction or a circumferential direction of the cooling pipe.

In one or more embodiments, the first thermal insulation structure is made of a material including cured carbon felt or cured graphite felt.

In one or more embodiments, the cooling apparatus further includes a gas storage tank, a plate heat exchanger and an suction pump, the crystal puller is provided with an exhaust pipe, an inlet side of the suction pump is connected to the exhaust pipe, an outlet side of the suction pump is connected to an inlet side of the plate heat exchanger, an outlet side of the plate heat exchanger is connected to an inlet side of the gas storage tank, and an outlet side of the gas storage tank is connected to the cooling pipe.

In one or more embodiments, the cooling apparatus further includes a transmission mechanism and a filtering mechanism. The gas storage tank, the plate heat exchanger, the suction pump and the jacking mechanism are arranged on the transmission mechanism. The filtering mechanism is connected between the suction pump and the exhaust pipe.

In one or more embodiments, the cooling apparatus further includes a telescopic connection structure, and the cooling apparatus is connected to the crystal puller through the connection structure. A sealing chamber is provided in the connection structure, and the cooling pipe is arranged in the sealing chamber.

In a second aspect of the present disclosure, a cooling method is further provided, for cooling the device for manufacturing monocrystalline silicon according to the first aspect of the present disclosure, the method including: during a cooling stage of the device for manufacturing monocrystalline silicon, connecting a cooling apparatus to the crystal puller, and enabling the cooling pipe of the cooling apparatus to enter into the crystal puller to be connected to the first thermal insulation structure in the crystal puller; enabling the jacking mechanism to control the cooling pipe to drive the first thermal insulation structure to rise to a set height; and enabling the cooling apparatus to release a cooling medium to the cooling pipe.

In one or more embodiments, after the cooling apparatus releasing an inert gas through the vent hole of the cooling pipe, the method further including: turning on the suction pump, so that a high-temperature gas in the crystal puller enters into the gas storage tank after being cooled by the plate heat exchanger, and the gas storage tank cyclically releasing the inert gas through the vent hole of the cooling pipe.

It should be understood that the general description above and the detailed description in the following are merely exemplary and illustrative, and cannot limit the present disclosure.

BRIEF DESCRIPTION OF DRAWINGS

FIG. 5 is a schematic structural diagram (I) of a thermal insulation structure; and FIG. 6 is a schematic structural diagram (II) of a thermal insulation structure.

Figure 1:
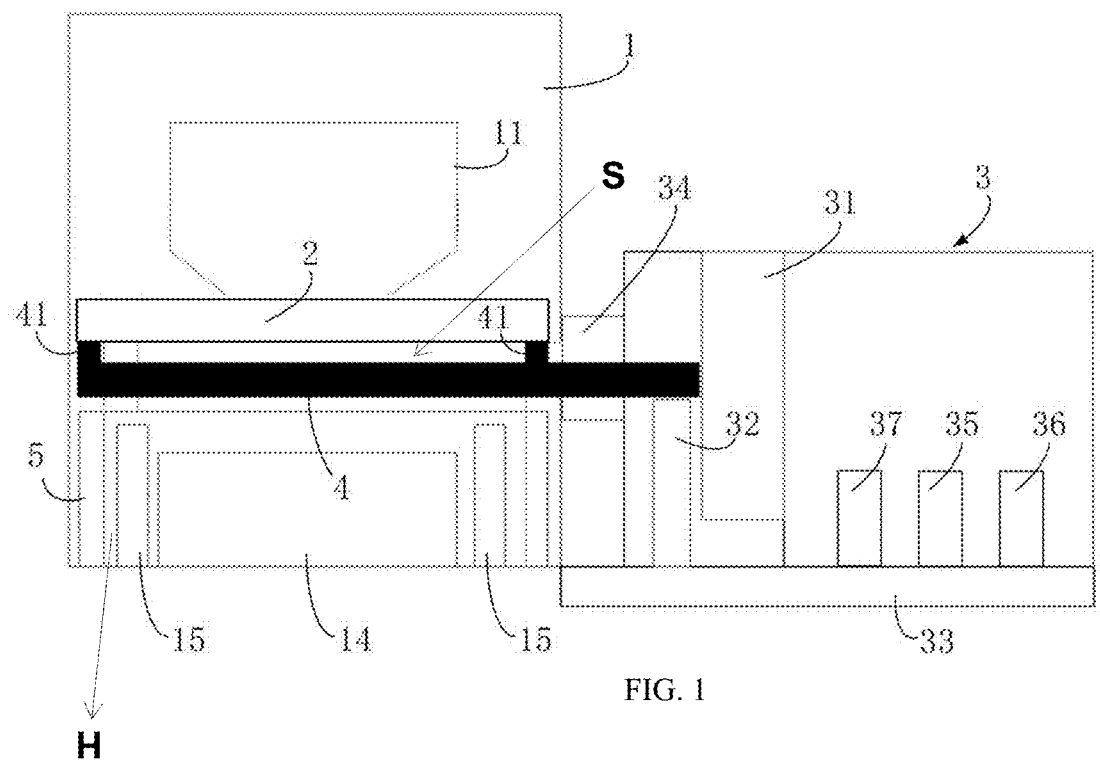
FIG. 1 is a schematic structural diagram of a device for manufacturing monocrystalline silicon according to one or more embodiments of the present disclosure.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

In order to better illustrate the objectives, technical solutions and advantages of the present disclosure, the present disclosure is described below in further detail with reference to the accompanying drawings and embodiments. It should be understood that specific embodiments described herein are intended only to interpret the present disclosure and not intended to limit the present disclosure.

In the description of the present disclosure, unless otherwise explicitly specified and defined, the terms "first" and "second" are used for descriptive purposes only, which cannot be construed as indicating or implying a relative importance. Unless otherwise specified or described, the term "a plurality of" means two or more. The terms such as "connecting" and "fixing" should be understood in a broad sense. For example, "connecting" may be a fixed connection, a detachable connection, an integral connection, or an electrical connection; or a direct connection, or an indirect connection through an intermediate medium. For those of ordinary skill in the art, the specific meanings of the above terms in the present disclosure can be understood case-by-case.

In the description of the specification, it is to be understood that orientation terms such as "above" and "below" described in embodiments of the present disclosure are described from the perspective shown in the drawings, and are not to be construed to limit the embodiments of the present disclosure. In addition, in the context, it is to be further understood that, when an element is formed "above" or "below" another element, the element may be directly connected "above" or "below" the other element, and may also be indirectly connected "above" or "below" the other element via an intermediate element.

As shown in FIG. 1 to FIG. 6, according to some embodiments of the present disclosure, a device for manufacturing monocrystalline silicon is provided, including a crystal puller 1 and a cooling apparatus 3. A heating apparatus and a first thermal insulation structure 2 are arranged in the crystal puller 1. The thermal insulation structure 2 is located above the heating apparatus. In addition, the heating apparatus includes a heating chamber H and a heater 15. The heater 15 is arranged around the heating chamber H to heat a crucible 14 in the heating chamber H, thereby keeping the temperature of the crucible 14. The crystal puller is further provided with a flow guide cylinder 11 configured to cool a single crystal ingot and speed up crystal pulling.

In the related art, in order to improve a thermal insulation effect of the crystal puller 1 when a silicon material is heated by the heating apparatus, a thermal insulation structure is generally arranged at an outer edge of the heating apparatus. The thermal insulation structure may concentrate heat in a region of the crucible 14, so that monocrystalline silicon can grow at a relatively stable temperature. In order to improve the thermal insulation effect, only a small gap exists between the thermal insulation structure and the heating apparatus, so as to prevent heat loss. However, after manufacturing of the monocrystalline silicon, the crystal puller 1 is required to be cooled and then put into use again. In the conventional cooling manner, the crystal puller 1 is naturally cooled at room temperature for a long cooling time, which is generally 5 to 9 hours. In addition, since the thermal insulation structure is arranged around the heating apparatus, the thermal insulation structure concentrates the heat in the region of the crucible 14, which is adverse to heat dissipation. As a result, the crystal puller 1 is more difficult to be cooled, thus reducing the production efficiency.

To this end, the device for manufacturing monocrystalline silicon according to some embodiments includes a cooling apparatus 3. The cooling apparatus 3 includes a jacking mechanism 32 and a cooling pipe 4. The cooling pipe 4 is provided with a vent hole 42. The cooling pipe 4 is capable of moving into or out of the crystal puller 1. When the device for manufacturing monocrystalline silicon is required to be cooled, the cooling pipe 4 is allowed to enter the crystal puller 1. The cooling pipe 4 can be connected to the first thermal insulation structure 2. Then, the cooling pipe 4 may lift the first thermal insulation structure 2 through the jacking mechanism 32 to increase a distance between the first thermal insulation structure 2 and the heating apparatus, and a cooling medium is output to the cooling pipe 4 to cool the crystal puller 1.

In some embodiments, the cooling medium includes liquid and gas. The liquid includes water. The gas includes any inert gas such as nitrogen, argon or helium.

When the cooling medium is liquid such as water, circulating cooling water is injected into the cooling pipe 4 through a water inlet, absorbs heat in the crystal puller 1, is cooled in the external cooling apparatus through a water outlet, and then is injected into the crystal puller for circulating cooling. The water inlet and the water outlet both extend into the crystal puller from the outside through the opening in the sidewall of the crystal puller.

In addition, when the cooling medium is liquid such as water, a closed structure is in the circumferential direction of the cooling pipe 4.

The jacking mechanism 32 may be, for example, an air cylinder or a hydraulic cylinder. In some embodiments, in order to provide a larger jacking force, the jacking mechanism 32 is a hydraulic cylinder. The cooling pipe 4 is connected to a piston rod of the hydraulic cylinder. After the cooling pipe 4 is connected to the first thermal insulation structure 2, the hydraulic cylinder controls the piston rod to extend to jack the cooling pipe 4. In this case, the cooling pipe 4 may drive the first thermal insulation structure 2 to rise synchronously, so that the first thermal insulation structure is gradually away from the heating apparatus in the axial direction, and the distance between the first thermal insulation structure 2 and the heating apparatus is increased. During this process, the inert gas such as argon or nitrogen provided by the cooling apparatus 3 may be blown to the heating apparatus and the first thermal insulation structure 2 through the vent hole 42 of the cooling pipe 4. Since the first thermal insulation structure 2 is at a larger distance from the heating apparatus after being lifted, the inert gas may also be blown to a region between the first thermal insulation structure 2 and the heating apparatus and an inner wall of the crystal puller 1. Therefore, a temperature in a region where the crucible 14 and the heating apparatus are located can be rapidly reduced, thereby increasing an overall cooling speed of the crystal puller 1, reducing the cooling time of the crystal puller 1 by 2 hours on average, enabling the crystal puller 1 to be quickly put into use again, and thus improving the production efficiency.

Figure 3:
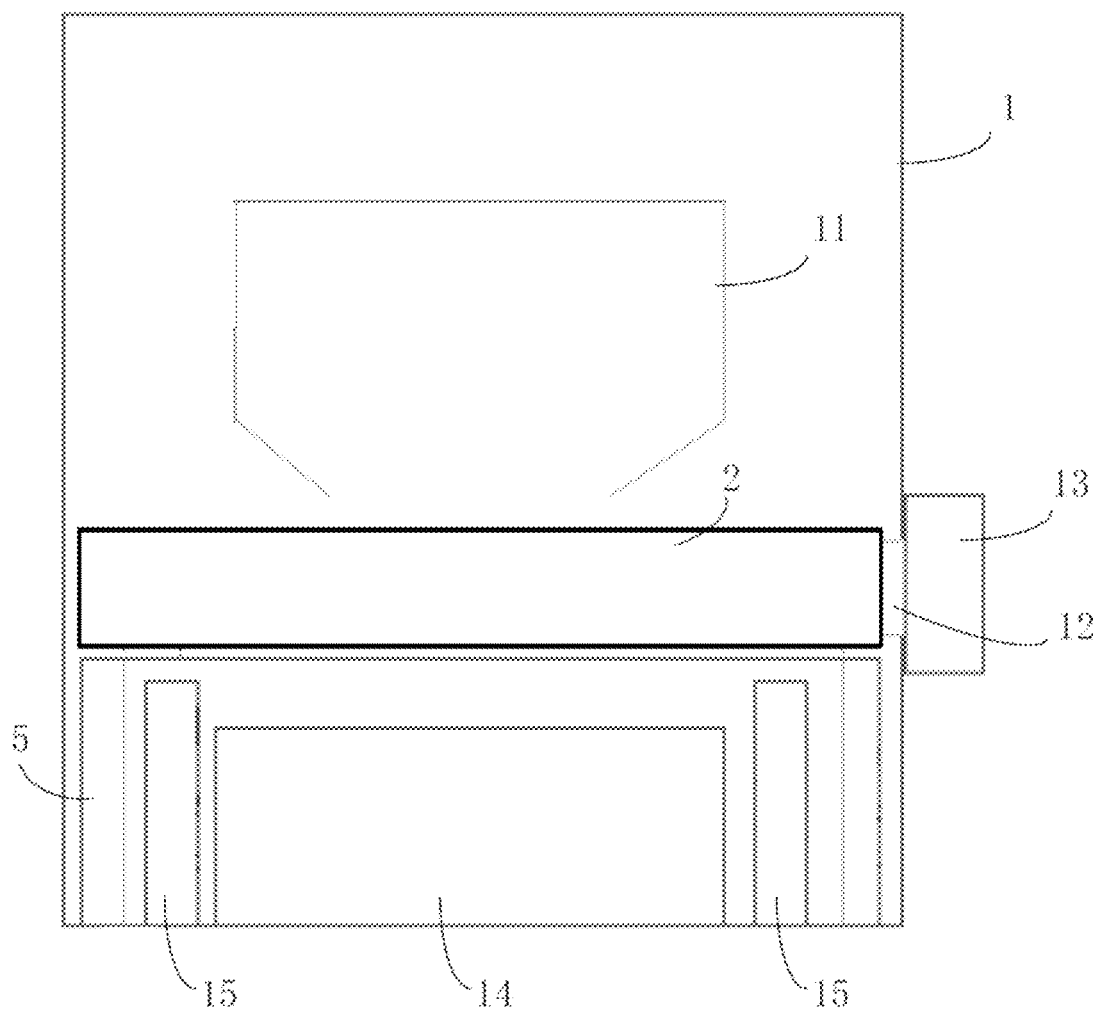
FIG. 3 is a schematic structural diagram of a crystal puller.

In some embodiments, as shown in FIG. 1 and FIG. 3, the device for manufacturing monocrystalline silicon further includes a second thermal insulation structure 5. The second thermal insulation structure 5 is arranged around the heating apparatus, and the first thermal insulation structure 2 covers the second thermal insulation structure 5. The first thermal insulation structure 2 may be lapped over the second thermal insulation structure 5, so that the heating apparatus can be enclosed therein through coordination between the first thermal insulation structure 2 and the second thermal insulation structure 5. As a result, heat can be concentrated in the region of the crucible 14 of the heating apparatus, which ensures the quality of growth of the ingot. In addition, when the cooling pipe 4 is lifted through the jacking mechanism 32, the cooling pipe 4 may drive the first thermal insulation structure 2 to rise synchronously to separate the first thermal insulation structure 2 from the second thermal insulation structure 5. Therefore, the distance between the first thermal insulation structure 2 and the heating apparatus can be increased, which makes it easy to blow the inert gas into positions between the heating apparatus and the first thermal insulation structure 2 and between the heating apparatus and the second thermal insulation structure 5 to accelerate the cooling.

In some embodiments, a sidewall of the crystal puller 1 is provided with an opening 12. The opening 12 may be configured for external feeding of silicon during crystal pulling and in the cooling stage. An isolation valve 13 may be arranged at the opening 12. During the feeding, the isolation valve 13 is opened, and an external feeding device may feed the crucible 14 through the opening 12. During manufacturing process of the ingot, the isolation valve 13 is closed, so that the crystal puller 1 is a closed space to isolate external air. In some embodiments, the cooling pipe 4 may also move into or out of the crystal puller 1 through the opening 12. When the crystal puller 1 is required to be cooled, the isolation valve 13 is opened, and the cooling pipe 4 can enter the crystal puller 1 from the opening 12 to release an inert gas into the crystal puller 1 to realize cooling. Upon completion of cooling, the cooling pipe 4 may be drawn out of the crystal puller 1 from the opening 12, and then the isolation valve 13 is closed, enabling the crystal puller 1 to be put into use again.

A diameter of the opening 12 is 50 to 100 mm larger than that of the cooling pipe 4, so that the cooling pipe 4 can have a jacking space ranging from 50 mm to 100 mm, and the first thermal insulation structure 2 can expand the distance between itself and the heating apparatus within this range. It is to be noted that, if the first thermal insulation structure 2 is at an excessively large distance from the heating apparatus after being jacked, cool air blown out of the cooling pipe 4 cannot reach the heating apparatus and the region between the heating apparatus and the first thermal insulation structure 2 adequately. If the first thermal insulation structure 2 is at an excessively small distance from the heating apparatus after being jacked, the first thermal insulation structure 2 may still concentrate more heat in a region above the heating apparatus, and an excessively small region between the first thermal insulation structure 2 and the heating apparatus is adverse to heat dissipation. To this end, in some embodiments, a jacking distance of the first thermal insulation structure 2 ranges from 50 mm to 100 mm, so that the inert gas blown out of the cooling pipe 4 can effectively cool the heating apparatus and the crystal puller 1 as a whole. In some embodiments, the diameter of the opening 12 may be 60 mm, 70 mm, 80 mm or 90 mm larger than that of the cooling pipe 4.

In some embodiments, as shown in FIG. 5 and FIG. 6, the first thermal insulation structure 2 is provided with support holes 21. The support holes 21 are configured to allow the cooling pipe 4 to pass through the first thermal insulation structure 2. The support holes 21 are symmetrically distributed along an axial direction of the first thermal insulation structure 2.

After the cooling pipe 4 enters the crystal puller 1 from the opening 12, the cooling pipe 4 may simultaneously penetrate into the support holes 21 at two ends of the first thermal insulation structure 2, so that the first thermal insulation structure 2 can be supported above the cooling pipe 4. When the cooling pipe 4 is jacked, the cooling pipe 4 may abut against inner walls of the support holes 21 to drive the first thermal insulation structure 2 to be jacked synchronously.

In some embodiment, the first thermal insulation structure 2 is of an annularly tubular structure, and the support hole 21 is arranged in the sidewall of the first thermal insulation structure 2. A shape of the support hole 21 may match a shape of a section of the cooling pipe 4, which may be, for example, a round hole, a square hole or a polygonal hole. Correspondingly, the shape of the section of the cooling pipe 4 may also be round, square or polygonal. In some embodiments, the support hole 21 is a round hole. As shown in FIG. 5, the cooling pipe 4 is of a cylindrical structure matching the round hole.

In some embodiments, the support hole 21 may also be a non-closed hole. That is, the support hole 21 is of a non-closed structure on one side of the first thermal insulation structure 2 facing the heating apparatus, as shown in FIG. 6. Therefore, the cooling pipe 4 can pass through the support hole 21 more easily without interfering with any entity part around the support hole 21.

Figure 4:
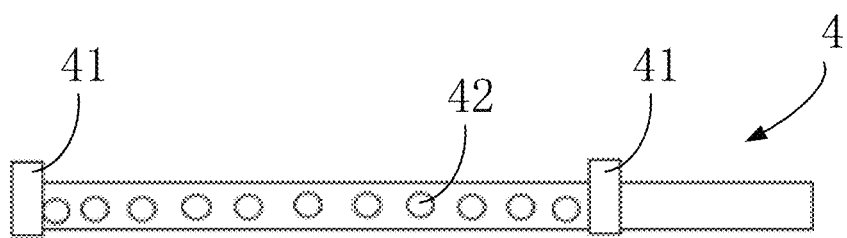
FIG. 4 is a schematic structural diagram of a cooling pipe.

In some embodiments, as shown in FIG. 1 and FIG. 4, the cooling pipe 4 is provided with a boss 41. The cooling 4 may be supported in the support holes 21 through the boss 41. The boss 41 may fit with the inner walls of the support holes 21 to ensure the stability of the cooling pipe 4 supporting the first thermal insulation structure 2. Two bosses 41 may be provided. The two bosses 41 can fit with two support holes 21 at opposite positions on the first thermal insulation structure 2, respectively.

In some embodiments, when the cooling medium is gas, for example, an inert gas such as nitrogen, argon or helium, the diameter of the cooling pipe 4 may range from 50 mm to 150 mm. Within the range of the diameter, an amount of the inert gas output from the cooling pipe 4 can be guaranteed to achieve sufficient cooling of the crystal puller 1, as well as to prevent a waste of the inert gas. In some embodiments, the diameter of the cooling pipe 4 may be 60 mm, 70 mm, 80 mm, 90 mm, 100 mm, 110 mm, 120 mm, 130 mm or 140 mm.

A diameter of the vent hole 42 on the cooling pipe 4 may range from 5 mm to 10 mm. In some embodiments, the diameter of the vent hole 42 may be 6 mm, 7 mm, 8 mm or 9 mm.

In some embodiments, as shown in FIG. 4, a plurality of vent holes 42 may be arranged in an axial direction or a circumferential direction of the cooling pipe 4, so that the inert gas may be blown out in different directions through the vent holes 42 to achieve cooling in a larger range and accelerate the cooling efficiency of the crystal puller 1.

In some embodiments, the first thermal insulation structure 2 may be made of a material including cured carbon felt or cured graphite felt. In some embodiments, the material is cured carbon felt. Cured carbon felt has high hardness, may be entirely supported on the cooling pipe 4 and can be synchronously jacked with the cooling pipe 4 to stay away from the heating apparatus, without collapse due to an excessively soft material.

Figure 2:
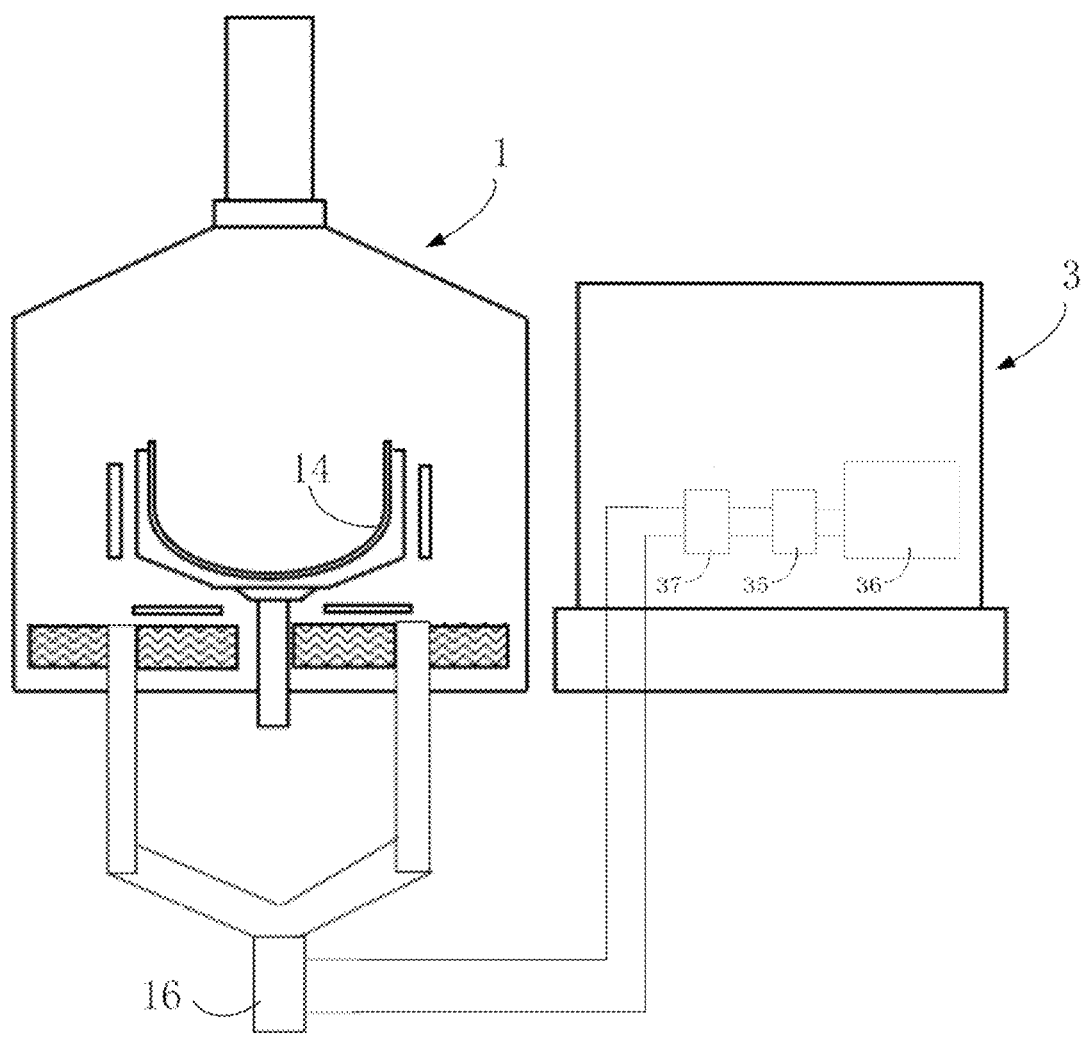
FIG. 2 is a diagram of a cooling principle of the device for manufacturing monocrystalline silicon according to one or more embodiments of the present disclosure.

In some embodiments, as shown in FIG. 1 and FIG. 2, the cooling apparatus 3 further includes a gas storage tank 31, a plate heat exchanger 36 and an suction pump 35. The crystal puller 1 is provided with an exhaust pipe 16. An inlet side of the suction pump 35 is connected to the exhaust pipe 16, an outlet side of the suction pump 35 is connected to an inlet side of the plate heat exchanger 36, an outlet side of the plate heat exchanger 36 is connected to an inlet side of the gas storage tank 31, and an outlet side of the gas storage tank 31 is connected to the cooling pipe 4.

The gas storage tank 31 may be configured to store the inert gas, and through an external drive device, the inert gas in the gas storage tank 31 may be blown into the crystal puller 1 through the cooling pipe 4. The inert gas may neutralize the high temperature of the crystal puller 1. Through the action of the suction pump 35, the inert gas may pass through the exhaust pipe 16 to take heat away from the crystal puller 1. Then, the inert gas with heat may be cooled by the plate heat exchanger 36, return to the gas storage tank 31, and be blown into the crystal puller 1 again through the cooling pipe 4, so as to realize circulating cooling.

In some embodiments, as shown in FIG. 1, the cooling apparatus 3 further includes a transmission mechanism 33 and a filtering mechanism 37. The gas storage tank 31, the plate heat exchanger 36, the suction pump 35 and the jacking mechanism 32 may be arranged on the transmission mechanism 33. The transmission mechanism 33 may realize the overall movement of the cooling apparatus 3, so that different crystal pullers 1 can be cooled alternately, thereby improving the production efficiency of the ingot. The transmission mechanism 33 may have an engagement structure of a slide rail and a slider or an engagement structure of a screw and a gear, which is not limited in the present disclosure.

In addition, the filtering mechanism 37 is connected between the suction pump 35 and the exhaust pipe 16, so as to filter the inert gas discharged from the crystal puller 1 for reuse.

In some embodiments, the cooling apparatus 3 further includes a telescopic connection structure 34, and the cooling apparatus 3 is connected to the crystal puller 1 through the connection structure 34. A sealing chamber S is arranged in the connection structure 34, and the cooling pipe 4 is arranged in the sealing chamber S.

In some embodiments, the connection structure 34 may be a corrugated pipe. When the cooling apparatus 3 is not connected to the crystal puller 1, the connection structure 34 may wrap the cooling pipe 4 therein. When the cooling apparatus 3 is connected to the crystal puller 1 through the corrugated pipe, the cooling pipe 4 may entirely approach to the crystal puller 1 with the cooling apparatus 3 to enter the crystal puller 1. During this process, the connection structure 34 is gradually compressed in its axial direction, and sealing performance at a junction between the cooling apparatus 3 and the crystal puller 1 is always ensured to prevent entry of external air.

According to some embodiments of the present disclosure, a cooling method is further provided, including the device for manufacturing monocrystalline silicon according to the present disclosure. The method includes the following steps.

In step S1, when the device for manufacturing monocrystalline silicon enters a cooling stage, a cooling apparatus is connected to the crystal puller 1, and the cooling pipe 4 of the cooling apparatus is enabled to enter the crystal puller 1 to be connected to the first thermal insulation structure 2 in the crystal puller 1.

In step S2, the jacking mechanism 32 is enabled to control the cooling pipe 4 to drive the first thermal insulation structure 2 to rise to a set height. A lifting height ranges from 50 mm to 100 mm. The cooling pipe 4 may drive the first thermal insulation structure 2 to be jacked to increase the distance between the first thermal insulation structure 2 and the heating apparatus, thereby making it easy to blow the inert gas into a region between the first thermal insulation structure 2 and the heating apparatus, which facilitates sufficient cooling of the crystal puller 1.

In step S3, the cooling apparatus is enabled to release a cooling medium, including water or gas, for the cooling pipe 4.

When the cooling medium is gas, subsequent to step S3, the method further includes the following step.

In step S4, the suction pump 35 is turned on, so that a high-temperature gas in the crystal puller 1 enters the gas storage tank 31 after being cooled by the plate heat exchanger 36 and the gas storage tank 31 cyclically releases the inert gas through the vent hole 42 of the cooling pipe 4.

After the inert gas neutralizes the high temperature in the crystal puller 1, the suction pump 35 may pump the inert gas out of the crystal puller 1, and transport the inert gas to the plate heat exchanger 36 for cooling. The inert gas cooled by the plate heat exchanger 36 can return to the gas storage tank 31 and then be blown into the crystal puller 1 again through the cooling pipe 4. Thus, the circulating cooling of the crystal puller 1 is realized, and the cooling efficiency is improved.

The above are only preferred embodiments of the present disclosure and are not intended to limit the present disclosure. For those skilled in the art, the present disclosure may have various modifications and variations. Any modifications, equivalent substitutions, improvements and the like made within the principle of the present disclosure should fall within the protection scope of the present disclosure.

What is claimed is:

1. A device for manufacturing monocrystalline silicon, comprising:
    a crystal puller;
    a heating chamber and a heater arranged in the crystal puller;
    a first thermal insulation structure arranged in the crystal puller and located above the heating chamber and the heater; and
    a cooling apparatus comprising a jacking mechanism and a cooling pipe, wherein the jacking mechanism comprises an air cylinder or a hydraulic cylinder, and the cooling pipe is capable of moving into or out of the crystal puller;

wherein when the cooling pipe enters the crystal puller, the cooling pipe is connected to the first thermal insulation structure, and the cooling pipe is configured to lift the first thermal insulation structure through the air cylinder or the hydraulic cylinder to increase a distance between the first thermal insulation structure and the heating chamber and the heater, and the cooling pipe is further configured to output a cooling medium through the cooling pipe to cool the crystal puller;

wherein the cooling pipe is arranged between the first thermal insulation structure and the heater.

2. The device for manufacturing monocrystalline silicon according to claim 1, wherein the cooling medium comprises at least one of water, nitrogen, argon or helium.

3. The device for manufacturing monocrystalline silicon according to claim 2, when the cooling medium is nitrogen, argon or helium, and a diameter of the cooling pipe ranges from 50 mm to 150 mm.

4. The device for manufacturing monocrystalline silicon according to claim 3, the diameter of the cooling pipe ranges from 60 mm to 140 mm.

5. The device for manufacturing monocrystalline silicon according to claim 1, further comprising a second thermal insulation structure arranged around the heating chamber and the heater, wherein the first thermal insulation structure covers over the second thermal insulation structure, and the cooling pipe is configured to lift the first thermal insulation structure through the air cylinder or the hydraulic cylinder to separate the first thermal insulation structure from the second thermal insulation structure.

6. The device for manufacturing monocrystalline silicon according to claim 1, wherein a sidewall of the crystal puller is provided with an opening, and the cooling pipe is capable of moving into or out of the crystal puller through the opening.

7. The device for manufacturing monocrystalline silicon according to claim 6, wherein a diameter of the opening is 50 to 100 mm larger than that of the cooling pipe.

8. The device for manufacturing monocrystalline silicon according to claim 7, the diameter of the opening is 60 to 90 mm larger than that of the cooling pipe.

9. The device for manufacturing monocrystalline silicon according to claim 1, wherein the first thermal insulation structure is provided with support holes for allowing the cooling pipe to pass through the first thermal insulation structure, and the support holes are symmetrically distributed along an axial direction of the first thermal insulation structure.

10. The device for manufacturing monocrystalline silicon according to claim 5, wherein the cooling pipe is provided with a boss, and the cooling pipe is supported in the support holes by the boss.

11. The device for manufacturing monocrystalline silicon according to claim 9, a shape of the support hole matches a shape of a section of the cooling pipe, which is a round hole, a square hole or a polygonal hole.

12. The device for manufacturing monocrystalline silicon according to claim 1, wherein the cooling pipe further comprises a plurality of vent holes arranged along an axial direction or a circumferential direction of the cooling pipe.

13. The device for manufacturing monocrystalline silicon according to claim 12, a diameter of the vent hole on the cooling pipe ranges from 5 mm to 10 mm.

14. The device for manufacturing monocrystalline silicon according to claim 1, wherein the first thermal insulation structure is made of a material comprising cured carbon felt or cured graphite felt.

15. The device for manufacturing monocrystalline silicon according to claim 1, wherein the cooling apparatus further comprises a gas storage tank, a plate heat exchanger and an suction pump, the crystal puller is provided with an exhaust pipe, an inlet side of the suction pump is connected to the exhaust pipe, an outlet side of the suction pump is connected to an inlet side of the plate heat exchanger, an outlet side of the plate heat exchanger is connected to an inlet side of the gas storage tank, and an outlet side of the gas storage tank is connected to the cooling pipe.

16. The device for manufacturing monocrystalline silicon according to claim 15, wherein the cooling apparatus further comprises a telescopic connection structure, and the cooling apparatus is connected to the crystal puller through the connection structure; and a sealing chamber is provided in the connection structure, and the cooling pipe is arranged in the sealing chamber.

* * * * *